(12) United States Patent
Lin

(10) Patent No.: US 7,488,675 B2
(45) Date of Patent: Feb. 10, 2009

(54) METHOD FOR FABRICATING IC BOARD WITHOUT RING STRUCTURE

(75) Inventor: Ting-Hao Lin, Taipei (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 32 days.

(21) Appl. No.: 11/684,583

(22) Filed: Mar. 9, 2007

(65) Prior Publication Data

US 2008/0216313 A1    Sep. 11, 2008

(51) Int. Cl.
     *H01L 21/44*    (2006.01)
(52) U.S. Cl. .................. 438/614; 438/667; 29/852; 29/25.01
(58) Field of Classification Search ................. 438/667, 438/614; 29/852, 25.01
See application file for complete search history.

(56) References Cited

U.S. PATENT DOCUMENTS

| | | | |
|---|---|---|---|
| 5,882,957 A | 3/1999 | Lin | 438/126 |
| 5,884,396 A | 3/1999 | Lin | 29/827 |
| 2003/0056366 A1 * | 3/2003 | Peng | 29/852 |
| 2006/0255009 A1 * | 11/2006 | Card et al. | 216/13 |

OTHER PUBLICATIONS

S. Wolf and R.N. Tauber(Silicon Processing for the VLSI Era, Vol. 1: Process Technology, 1986).*

* cited by examiner

*Primary Examiner*—Fernando L Toledo
*Assistant Examiner*—Jae Lee

(57) ABSTRACT

A method for fabricating an IC board without a ring structure is provided. In the method, after the completion of the core board (including the core through hole), the second pattern photoresist layer is used to mask over the first deposited metal layer, and a portion of the second deposited metal layer (this portion of the second deposited metal layer is to electrically couple to the conductive circuit of the core through hole). Later, the second deposited metal layer, the first deposited metal layer, the metal layer, and the substrate at the innermost layer which are not masked by the second pattern photoresist layer are removed. As a result, the substrate is exposed to form the ringless structure, and to couple a conductive line to the core board through hole.

4 Claims, 5 Drawing Sheets

METHOD FOR FABRICATING IC BOARD WITHOUT RING STRUCTURE

BACKGROUND OF THE INVENTION

1. Field of the Invention

The present invention relates to a method for fabricating an IC board, and more particularly to a method for fabricating an IC board without a ring structure.

2. The Prior Arts

As the trend for electronic products to become lighter, smaller, and thinner continues, adding to the never ending additions in functionalities, the I/O ports of semiconductor chips are being led to increase rapidly. Correspondingly, the chip packaging technologies are also continuously updated. Nowadays in high-end IC products, the Flip Chip technique has been adopted to reduce the package size and to squeeze into more circuits on an IC board. The chip fabrication technology has been improved from 90 nm rapidly to 65 nm, and even all the way to 45 nm production capability. At the same time, the conductive lines on the IC board have become thinner. The conductive line is narrowed down rapidly from 50 µm to 20 µm (pitch 40 µm), and even 15 µm (pitch 30 µm) has been suggested.

In the IC board fabrication process, the substrate build up process is usually utilized to form each layer; and laser via hole or through hole drilling and copper electroplating method are used for achieving the goal of coupling various different separate layers. Under typical design criteria, the metal capture ring is designed around the laser via holes or through holes for accomplishing the following: (1) to prevent insufficient thickness and broken circuit caused by the attacking of the copper inside the laser via holes by the etchant during the etching process; (2) during the performing of pattern plating, a sufficient distance is provided to the laser via holes for preventing the covering of the via holes by the photoresist to negatively affect plating capability.

Therefore, under consideration of the above restrictions, designers require to take into consideration of alignment capability during the fabrication for determining the dimensions of the capture ring. However, in regards to the tiny pitch ring for through holes applications, the reduction in the size of the single side of the ring from 25 µm to 15 µm becomes a much more difficult challenge to overcome.

Under conventional design technique, the method is based on the reduction of the ring size to obtain a narrower conductive trace pitch for increasing the layout density, increasing the line width, or decreasing the substrate size and the build-up layer. However, because the manufacturing equipment would possess a certain amount of tolerance in the alignment of the manufacturing equipment, the designer is subjected to design limitations in regards to the reduction of the size of the ring. The acknowledged conventional design rule of the IC board is to be about 50 µm for one-side of the metal ring. This aforementioned size still occupies quite a substantial amount of limited space as well as putting a constraint on the layout design. Even though advancements in alignment accuracy of manufacturing equipment or in the more complicated manufacturing techniques can reduce ring size, high capital expenditure and manufacturing costs would correspondingly be the price to be paid.

For the reasons stated above, and for other reasons stated below, several researchers have proposed the ringless design for breaking through conventional design thinking. As a result, the ringless structural design is applied in improved layout designs by disregarding the laser via holes ring issues, and is thus able to reduce the footprint, increase the layout density, and reduce the design layout difficulties. In addition, because of the thinning width of the conductive line, the adhesion between the conductive lines and the substrate material is dramatically decreased, and becomes a major challenge to product reliability. Hence the new IC board structure and fabrication method will become apparent to those skilled in the art to be addressing these issues.

SUMMARY OF THE INVENTION

A primary objective of the present invention is to provide a method for fabricating an IC board without a ring structure which includes the exposing of the innermost layer of the substrate by removing the second deposited metal layer, the first deposited metal layer, and the metal layer, which have not been masked by the second pattern photoresist layer.

Another objective of the invention is to realize the purposes for creating space to layout more circuits.

Still another objective of the invention is to reduce circuit pitch and be able to reduce the limitation placed on conventional trace width design.

A further objective of the invention is to improve production yield and to effectively reduce the manufacturing cost.

In accordance with the above and other objectives, the method for fabricating an IC board without a ring structure includes the following: a substrate is provided; a metal layer is formed on the substrate; at least one core through hole is formed through the metal layer and the substrate; a first deposited metal layer is formed on the metal layer and a sidewall of the core through hole; a first pattern photoresist layer is formed on the first deposited metal layer, and the first pattern photoresist layer has maintained a photoresist layer opening over the core through hole; and the photoresist layer opening still extends outwards at a pre-set space from the sides of the core through hole; a second deposited metal layer is formed on the surface of the pre-set space and the inside of the core through hole; the first pattern photoresist layer is removed; a second pattern photoresist layer is formed over the first deposited metal layer above the metal layer, and a portion of the second deposited metal layer, and the first deposited metal layer, which have been masked underneath the second pattern photoresist layer, and a portion of the second deposited metal layer are electrically coupled to a conductive line of the core through hole; the metal layer, the first deposited metal layer, and the second deposited metal layer which have not being masked by the second pattern photoresist layer are etched; the substrate is etched until exposure; then, the second pattern photoresist layer is removed.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

With reference to the drawings and in particular to FIGS. 1E~1J, a fabrication process flow schematics of an IC board without a ring structure according to the present invention are shown. As referred in FIGS. 1A~1D, the conventional method for fabricating a core board is shown. On the other hand, FIGS. 1E~1J illustrate the fabrication method according to the present invention.

Figure 1A:
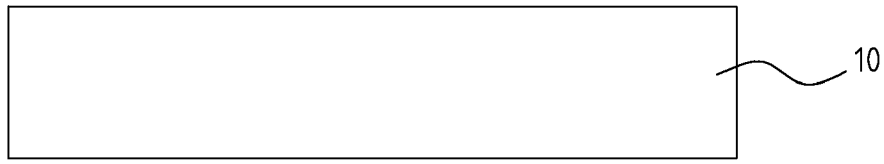
FIGS. 1A~1D are a plurality of fabrication flow schematics of a conventional core board.
Figure 1B:
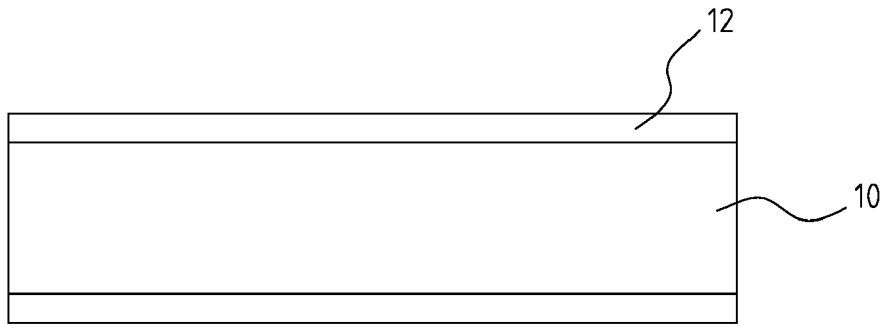
Figure 1C:
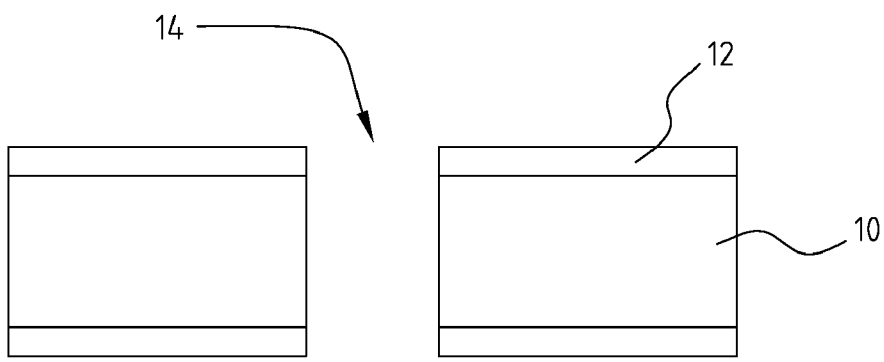
Figure 1D:
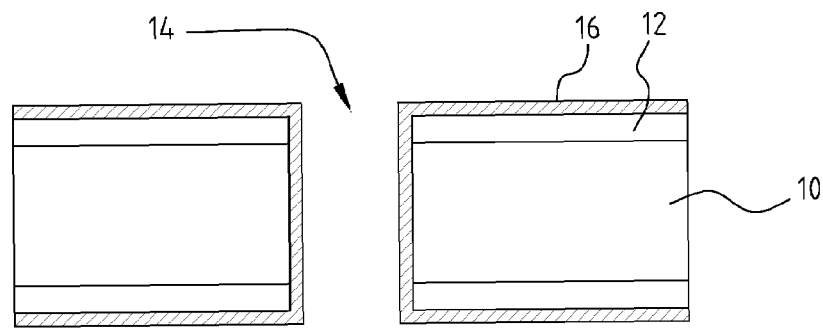

In accordance with the method for fabricating an IC board without a ring structure according to the present invention, a substrate 10 with a thickness of about 0.2 mm is first provided, in which the material of the substrate 10 can be Bismaleimide Triazine (BT), other organic materials, or even some ceramics. Then, a metal layer 12 with thickness about 1~12 μm is formed on the substrate 10, as shown in FIG. 1B. Later, the core through hole 14 is drilled at about 100~300 μm in diameter by using mechanical or laser drilling method, as shown in FIG. 1C. Then, a conductive material, for example, copper can be used as the fill material. A first deposited metal layer 16 with a thickness of about 10~20 μm is deposited on the metal layer 12 and the sidewalls of the core through hole 14, as shown in FIG. 1D.

Figure 1E:
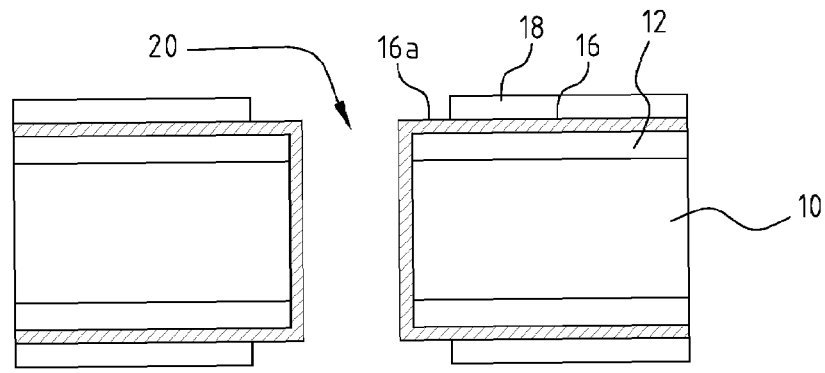
FIGS. 1E~1J are a plurality of fabrication flow schematics of an IC board without a ring structure according to the present invention.
Figure 1F:
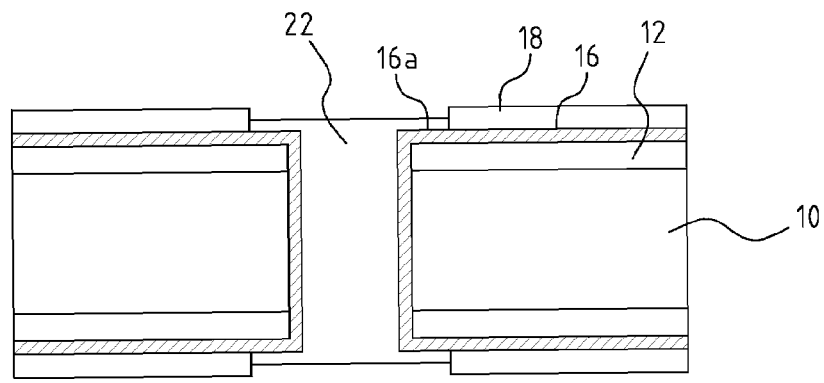
Figure 1G:
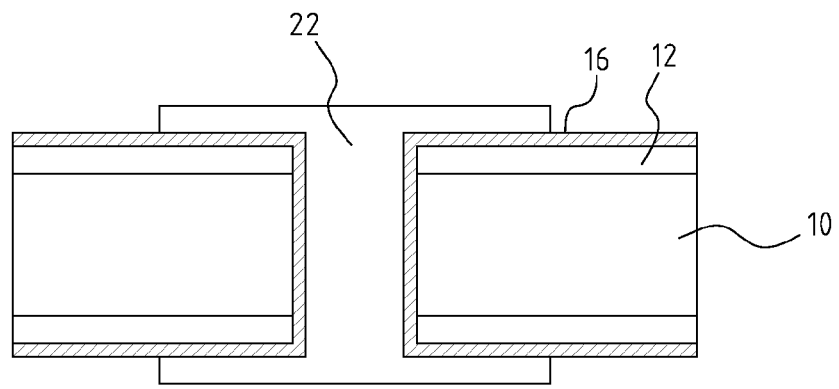
Figure 1H:
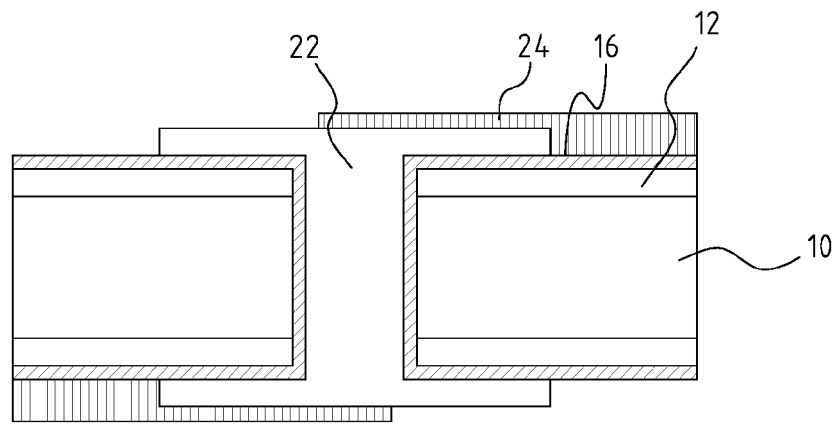
Figure 1I:
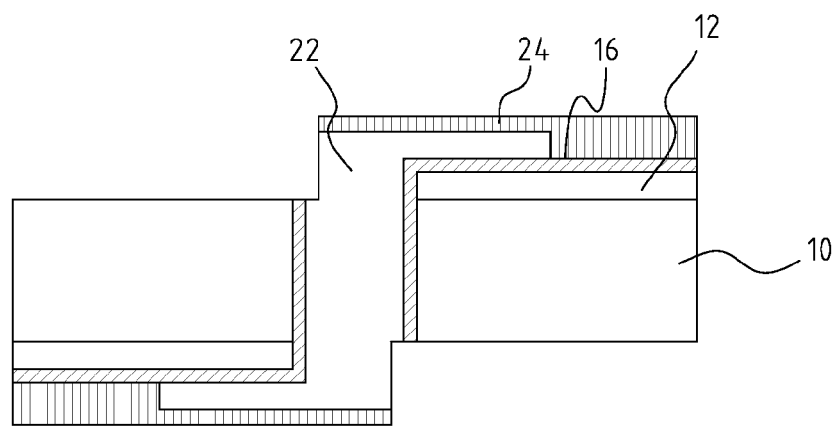
Figure 2:
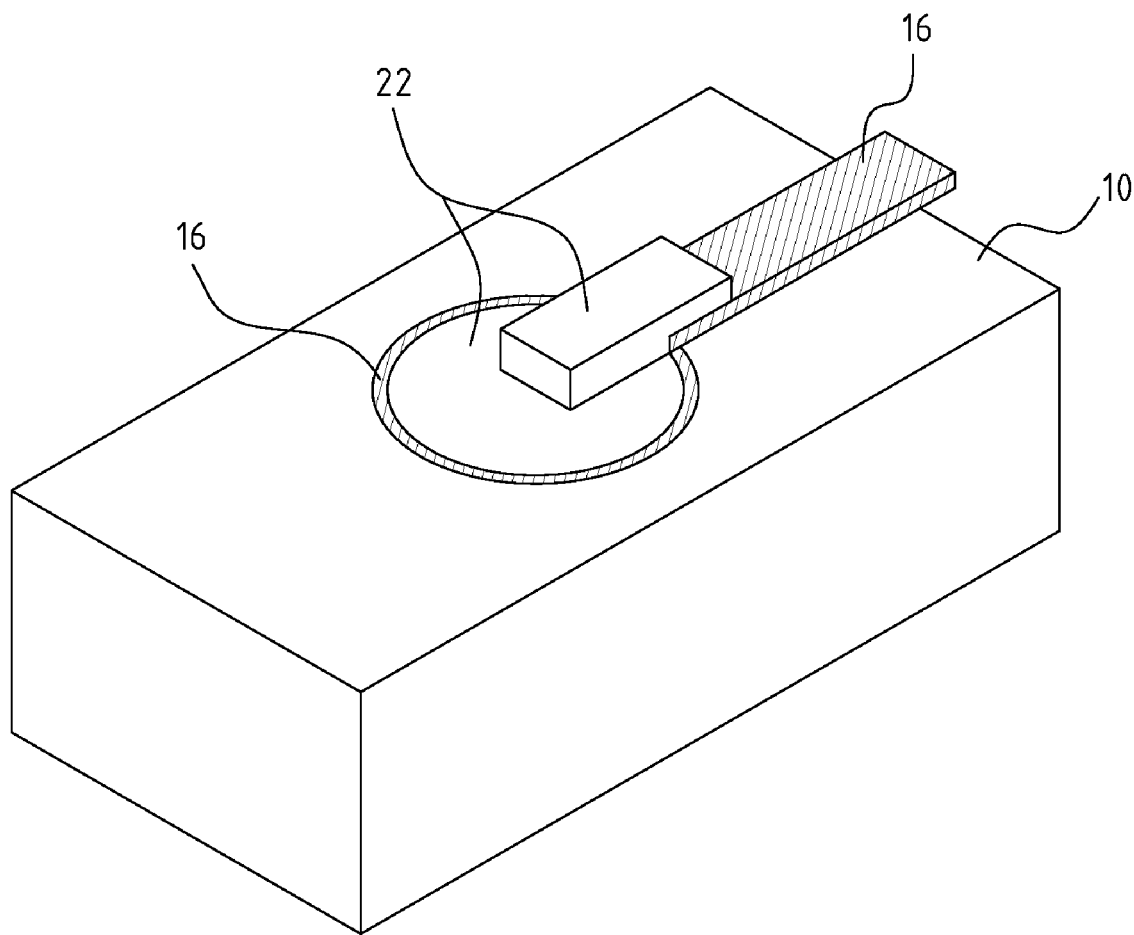
FIG. 2 is a schematic view showing the IC board without a ring structure according to the present invention.

In short, in the method for fabricating an IC board without a ring structure according to the present invention, after the completion of the aforementioned conductive core board (which includes the core through hole 14), the first deposited metal layer 16 and a portion of the second deposited metal layer 22 are masked by the second pattern photoresist layer 18 (wherein this portion of the second deposited metal layer 22 are to electrically couple to the conductive circuit of the core through hole 14), as shown in FIG. 1H; the first deposited metal layer 16, the metal layer 12, and the second deposited metal layer 22 which are not masked by the second pattern photoresist layer 18 are removed, as shown in FIG. 1I, until the substrate 10 which is the innermost layer is exposed, thereby forming the ringless structure where the circuit is connected to the core through hole 14, as shown in FIG. 2.

During the formation of the aforementioned second deposited metal layer 22, the first pattern photoresist layer 18 is defined, as shown in FIG. 1E. Then, electroplating is used to form the second deposited metal layer 22, as shown in FIG. 1F. Referring to FIG. 1E, the formed first pattern photoresist layer 18 is above the first deposited metal layer 16, which is above the metal layer 12; and the photoresist layer opening 20 has been reserved at above the core through hole 14; and the photoresist layer opening 20 occupies the pre-set space 16a from the edges of the core through hole 14. When the second deposited metal layer 22 is formed on the pre-set space 16a and at the inside of the core through hole 14, the height of the second deposited metal layer 22 can be lower than the photoresist layer opening 20 and higher than the first deposited metal layer 16, as shown in FIG. 1F.

Figure 1J:
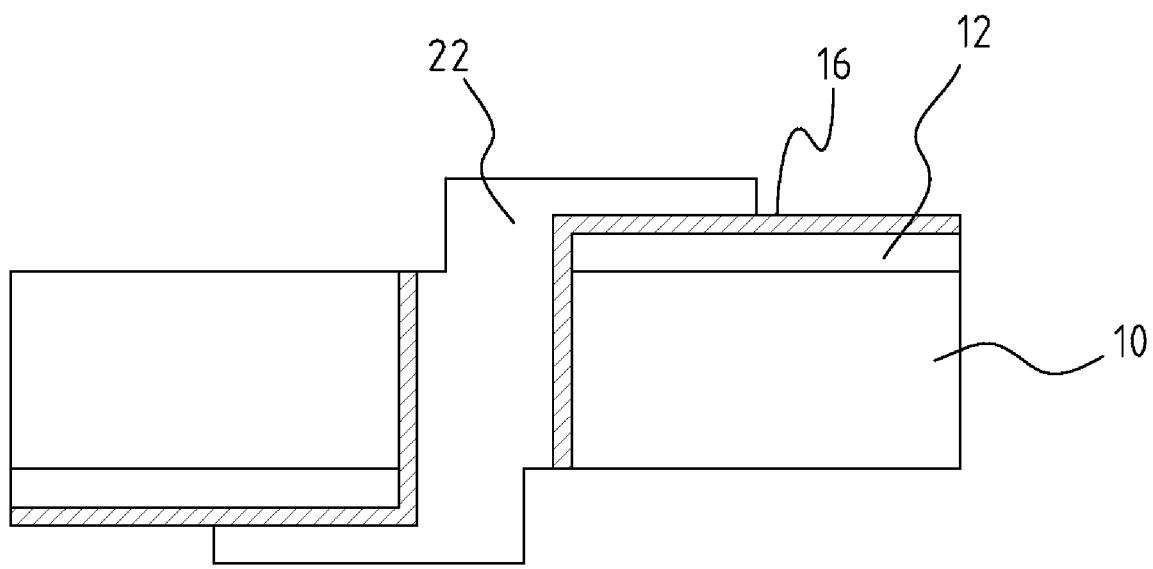

In order to form a conductive circuit with the core through hole 14 (where the conductive connection path is provided by using a portion of the second deposited metal layer 22 and the first deposited metal layer 16), the first pattern photoresist layer 18 should be removed, as shown in FIG. 1G. Then the second pattern photo resist layer 24 should be formed on top of a portion of the second deposited metal layer 22 which is on top of the first deposited metal layer 16 which is on top of the metal layer 12 as shown in FIG. 1H. The second photoresist layer 24 only covers a portion of the second deposited metal layer 22 above the core through hole 14 to reduce the area covered by the second deposited metal layer 22 after etching. A conductive circuit is formed with the core through hole 14 by the first deposited metal layer 16 and a portion of the second deposited metal layer 22 that are masked by the second pattern photoresist layer 24. Later, the uncovered portion of the second deposited metal layer 22, the first deposited metal layer 16, and the metal layer 12, as shown in FIG. 1I, are etched to expose the substrate 10, which is at the innermost layer, to form the ringless structure. Finally, the second pattern photoresist layer 24 is removed, as shown in FIG. 1J.

After etching away the uncovered portion of the second deposited metal layer 22, the first deposited metal layer 16, and the metal layer 12, the height of the second deposited metal layer 22 is level with respect to the surface of the substrate 10. It is worth mentioning that above the core through hole 14, only a small portion of the second deposited metal layer 22 is left for the conductive path above the surface level of the substrate 20 as shown in FIG. 2. As a result, narrow conductive lines can be formed for increasing layout density of a circuit.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating an IC board without a ring structure, comprising the steps of:
   providing a substrate;
   forming a metal layer on the substrate;
   forming at least one core through hole by drilling through the metal layer and the substrate;
   forming a first deposited metal layer on the metal layer and a sidewall of the core through hole;
   forming a first pattern photoresist layer on the first deposited metal layer, and the first pattern photoresist layer having the photoresist layer opening at above the core through hole, and the photoresist layer opening occupying a pre-set space around the edges of the core through hole;
   forming a layer of second deposited metal layer on the surface of the pre-set space and filling the inside of the core through hole;
   removing the first pattern photoresist layer;
   forming a layer of second pattern photoresist layer to cover the first deposited metal layer and a portion of the second deposited metal layer with the second pattern photoresist layer extending partially across the core through hole;
   etching the uncovered portion of the second deposited metal layer, the first deposited metal layer, and the metal layer until the substrate is exposed; and
   removing the second pattern photoresist layer;
   wherein the remaining first deposited metal layer and the remaining second deposited metal layer after etching are electrically coupled to a conductive circuit of the core through hole with the remaining second deposited metal layer forming a protruded step structure of the second deposited metal layer above the core through hole to connect the second deposited metal layer filling the inside of the core through hole to the first deposited metal layer.

2. The method as claimed in claim 1, wherein the first deposited metal layer and the second deposited metal layer are made of copper.

3. The method as claimed in claim 1, wherein the second deposited metal layer is formed on the pre-set space and the core through hole, and the height of the second deposited metal layer is lower than the photoresist layer opening and higher than the first deposited metal layer.

4. The method as claimed in claim 1, wherein the second deposited metal layer above the core through hole is flat with respect to the surface of the substrate except for the protruded step structure of the second deposited metal layer.

* * * * *